United States Patent
Okuma

(10) Patent No.: US 10,153,016 B2
(45) Date of Patent: Dec. 11, 2018

(54) APPARATUS OF OFFSET VOLTAGE ADJUSTMENT IN INPUT BUFFER

(71) Applicant: Micron Technology, Inc., Boise, ID (US)

(72) Inventor: Sadayuki Okuma, Tama (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/702,848

(22) Filed: Sep. 13, 2017

(65) Prior Publication Data

US 2018/0082721 A1 Mar. 22, 2018

Related U.S. Application Data

(63) Continuation of application No. 15/270,996, filed on Sep. 20, 2016, now Pat. No. 9,792,964.

(51) Int. Cl.
*G11C 7/10* (2006.01)
*G11C 5/14* (2006.01)
*G11C 29/12* (2006.01)

(52) U.S. Cl.
CPC ............ *G11C 7/1084* (2013.01); *G11C 5/147* (2013.01); *G11C 29/1201* (2013.01); *G11C 29/12005* (2013.01); *G11C 29/12015* (2013.01); *G11C 7/1045* (2013.01)

(58) Field of Classification Search
CPC ............................... G11C 7/1084; G11C 5/147
USPC ..................................................... 365/189.05
See application file for complete search history.

(56) References Cited

U.S. PATENT DOCUMENTS

| | | | | |
|---|---|---|---|---|
| 5,818,088 A * | 10/1998 | Ellis | ..................... | H01L 27/0251 257/355 |
| 6,489,819 B1 * | 12/2002 | Kono | ..................... | G11C 29/14 327/141 |
| 7,743,297 B2 * | 6/2010 | Uchida | .......... | G01R 31/318575 714/726 |
| 7,995,408 B2 | 8/2011 | Kang | | |
| 8,368,422 B1 * | 2/2013 | Dale | ................ | H03K 19/00346 324/73.1 |
| 8,957,695 B2 | 2/2015 | Takahashi et al. | | |
| 9,792,964 B1 * | 10/2017 | Okuma | ................ | G11C 7/1084 |

(Continued)

FOREIGN PATENT DOCUMENTS

TW    I276820 B    3/2007

OTHER PUBLICATIONS

U.S. Appl. No. 15/270,996, entitled "Apparatus of Offset Voltage Adjustment in Input Buffer", filed Sep. 20, 2016, pp. all.

(Continued)

*Primary Examiner* — Son Mai
*Assistant Examiner* — Muna A Techane
(74) *Attorney, Agent, or Firm* — Dorsey & Whitney LLP

(57) ABSTRACT

Apparatuses for providing external terminals of a semiconductor device are described. An example apparatus includes an input pad, an input buffer including a first input node and a second input node, a switch that couples the first input node and the second input node in an active state and further decouples the first input node and the second input node in an inactive state, a control circuit that provides a signal causing the switch to be in the active state or an inactive state. The first input node of the input buffer is coupled to the input pad by a conductive wiring.

17 Claims, 10 Drawing Sheets

(56) References Cited

U.S. PATENT DOCUMENTS

| | | |
|---|---|---|
| 2003/0012065 A1 | 1/2003 | Chang et al. |
| 2007/0070717 A1 | 3/2007 | Kim |
| 2009/0122634 A1* | 5/2009 | Kang .................... G11C 5/147 |
| | | 365/226 |
| 2010/0194447 A1 | 8/2010 | Garrett |
| 2013/0082718 A1* | 4/2013 | Dale .............. G01B 31/318572 |
| | | 324/555 |
| 2013/0153898 A1* | 6/2013 | Takahashi ............... H01L 22/32 |
| | | 257/48 |

OTHER PUBLICATIONS

International Search Report and Written Opinion dated Nov. 22, 2017 for PCT Application No. PCT/US2017/045892, pp. all.
English translation of First Office Action; TW Application No. 106128743, dated Aug. 1, 2018.

* cited by examiner

APPARATUS OF OFFSET VOLTAGE ADJUSTMENT IN INPUT BUFFER

CROSS REFERENCE TO RELATED APPLICATION(S)

This application is a continuation of U.S. patent application Ser.No. 15/270,996 (the '996 Application) filed Sep. 20, 2016, issued as U.S Pat. No. 9,792,964 (the '964 Patent) on Oct. 17, 2017. The aforementioned '996 Application and the '964 Patent are incorporated herein by reference in their entireties, for any purpose.

BACKGROUND

High data reliability, high speed of memory access, reduced chip size, and reduced power consumption are features that are demanded from semiconductor memory.

In recent years, there has been an effort to reduce power consumption by providing input signals having with reduced voltages. The reduced voltages indeed reduce power consumption. However, the reduced voltages may cause voltage sensitivity issues in an input buffer. For example, the input buffer may have an offset voltage (Voff) that is a gap between a reference voltage ($V_{REF}$) that is provided to determine an inversion point (Vx=the voltage of an input node corresponding to a transition of a voltage at an output node from a logic low level "L" to a logic high level "H") between a logic high level and a logic low level of an input signal and a threshold voltage used in the input buffer responsive to the reference voltage ($V_{REF}$). Offset voltages (Voff) of input buffers may slightly vary the inversion point (Vx) from device to device, and the reduced small voltage amplitudes have small tolerances for the small offset voltages that introduce undesired errors in determining the inversion point based on the reference voltage ($V_{REF}$) voltage as designed.

In order to alleviate the effect of the offset voltage (Voff) of each input buffer to a preferable level, an offset voltage Voff adjustment circuit including a test input buffer and a main input buffer having the offset voltage (Voff), may be provided. FIG. 1A is a schematic diagram of an offset voltage (Voff) adjustment circuit in a semiconductor device in a normal mode, including an input pad, a test input buffer and a main input buffer. FIG. 1B is a schematic diagram of the offset voltage (Voff) adjustment circuit in the semiconductor device in a test mode, which reduces the offset voltage (Voff) and thus makes Vx closer to $V_{REF}$.

The offset (Voff) adjustment circuit may include the test input buffer for testing. For example, the test input buffer may be an input buffer that receives an input signal from an input pad. For example, the input signal may have a suitable voltage for complementary metal-oxide semiconductor (CMOS) devices. For example, the test input buffer may include a logic AND gate.

The offset (Voff) adjustment circuit may include a switch SW1 between an input pad, the test input buffer and the main input buffer. The switch SW1 switches between an input node of the main input buffer and an input node of the test input buffer, and thus the switch SW1 couples the input pad to one of the input node of the main input buffer and the input node of the test input buffer. For example, a pass gate may be used as the switch SW1. The offset (Voff) adjustment circuit may include a switch SW2 between a reference node having a reference voltage ($V_{REF}$) and the input node of the main input buffer. When the switch SW2 is turned on (e.g., closed), the switch SW2 couples a reference voltage generator to the input node of the main input buffer, and the reference voltage ($V_{REF}$) may be provided to the input node of the main input buffer.

The offset (Voff) adjustment circuit may include the main input buffer that has the input node and a reference input node coupled to the reference node having the reference voltage ($V_{REF}$). The main input buffer detects a relative voltage of an input voltage at the input node to the reference voltage ($V_{REF}$) and determines an output voltage of an output signal. For example, the main input buffer may provide the output signal at a logic high level when the relative voltage is positive, which means that the input voltage is higher than the reference voltage ($V_{REF}$). The main input buffer may provide the output signal at a logic low level, if the relative voltage is negative, which means that the input voltage is lower than the reference voltage ($V_{REF}$). For example, the main input buffer may include a comparator circuit.

In the normal mode, for example, the switch SW1 couples the input pad to the input node of the main input buffer, as shown in FIG. 1A. Thus, the input voltage ($V_{IN}$) of the input signal may be provided to the input node of the main input buffer when the switch SW1 is turned on. The switch SW2 is not turned on and is open. FIG. 2 is a graph-based diagram showing relationships between an output level of a main input buffer and a combination of the input voltage ($V_{IN}$) and the reference voltage ($V_{REF}$). As shown in FIG. 2 of "Output Level (Ideal)" and previously described, the main input buffer is designed to provide the output signal at a logic low level ("L") when the input voltage ($V_{IN}$) is lower than the reference voltage ($V_{REF}$). The main input buffer is designed to provide the output signal at a logic high level ("H") when the input voltage ($V_{IN}$) is higher than the reference voltage ($V_{REF}$). In this situation, Voff=0 and Vx=$V_{REF}$. This is an ideal case, however, an offset voltage (Voff) of an actual input buffer tends to be non-zero, thus the inversion point Vx differs from the reference voltage ($V_{REF}$). To adjust this error, a test mode has been used.

In the test mode, the switch SW1 couples the input pad to the test input buffer and the switch SW2 couples the reference node to the input node of the main input buffer, as shown in FIG. 1B. Thus, the reference voltage ($V_{REF}$) is provided to the input node of the main input buffer. The main input buffer has an offset voltage (Voff) adjustment functionality for adjusting the offset voltage (Voff) based on a test signal (e.g., Voff adjust control flags TVxAdj). For example, the test signals, such as Voff adjust control flags TVxAdj, may take eight different values from 0 to 7, however, the values may not be limited to the range from 0 to 7. The main input buffer may change a level of the output signal responsive to the test signals. For example, an input buffer as shown in FIG. 2, may have an inversion point (Vx) to determine whether the main input buffer may provide the output signal having a logic high level ("H") or a logic low level ("L") that becomes lower than the reference voltage ($V_{REF}$) as designed, responsive to the Voff adjust control flags TVxAdj representing a value that is equal to or less than "2". On the other hand, the input buffer as shown in FIG. 2 may have the inversion point (Vx) that becomes higher than the reference voltage ($V_{REF}$) as designed, responsive to the Voff adjust control flags TVxAdj having a value that is equal to or greater than "3". A tester (not shown) may monitor the logic level of the output signal of the main input buffer in the test mode, and may further determines that the Voff adjust control flags TVxAdj having a value "2" may be used for Voff adjustment of the main input buffer. Because the offset voltages of input buffers may vary due to variations of MOS devices, the appropriate value of the Voff adjust control flags TVxAdj varies from input buffer to input buffer. The tester may set an appropriate value of the Voff adjust control flags TVxAdj, using a fuse in the semiconductor device including the input buffers, in order to adjust an offset voltage Voff for each input buffer. For example, the tester may be located outside of the semiconductor device.

In the above Voff adjustment circuit, the switch SW1 is coupled to the input pad and the main input buffer in series. Typically, the switch SW1 including MOS devices causes impedance in the Voff adjustment circuit between the input pad and the main input buffer. The impedance in the Voff adjustment circuit lowers an operational speed of the semiconductor device. Thus, a Voff adjustment circuit without the switch SW1 between the input pad and the main input buffer is desirable.

DETAILED DESCRIPTION OF PREFERRED EMBODIMENTS

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessary mutually exclusive, as some disclosed embodiments can be combined with one or more other disclosed embodiments to form new embodiments.

Figures 1A, 1B:
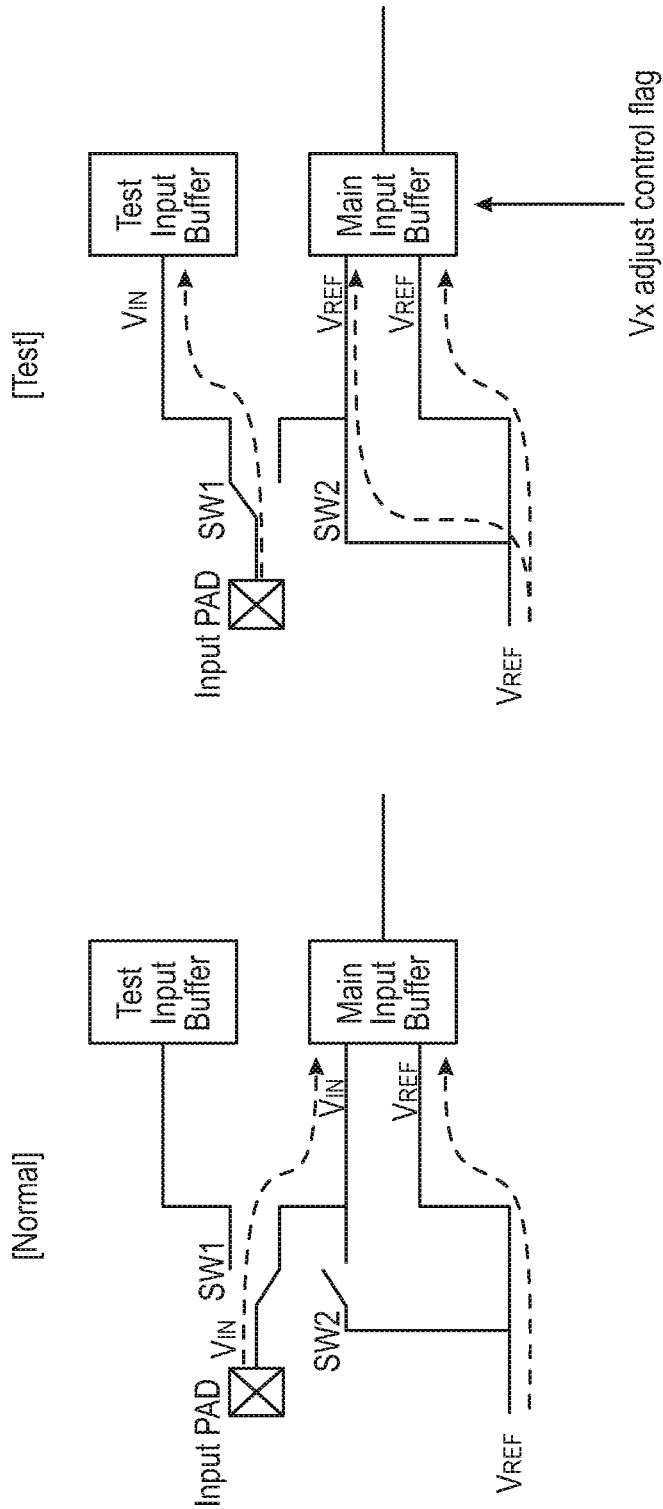
FIG. 1A is a schematic diagram of an offset voltage (Voff) adjustment circuit in a semiconductor device in a normal mode, including an input pad, a test input buffer and a main input buffer.
FIG. 1B is a schematic diagram of the offset voltage (Voff) adjustment circuit in the semiconductor device in a test mode.
Figure 2:
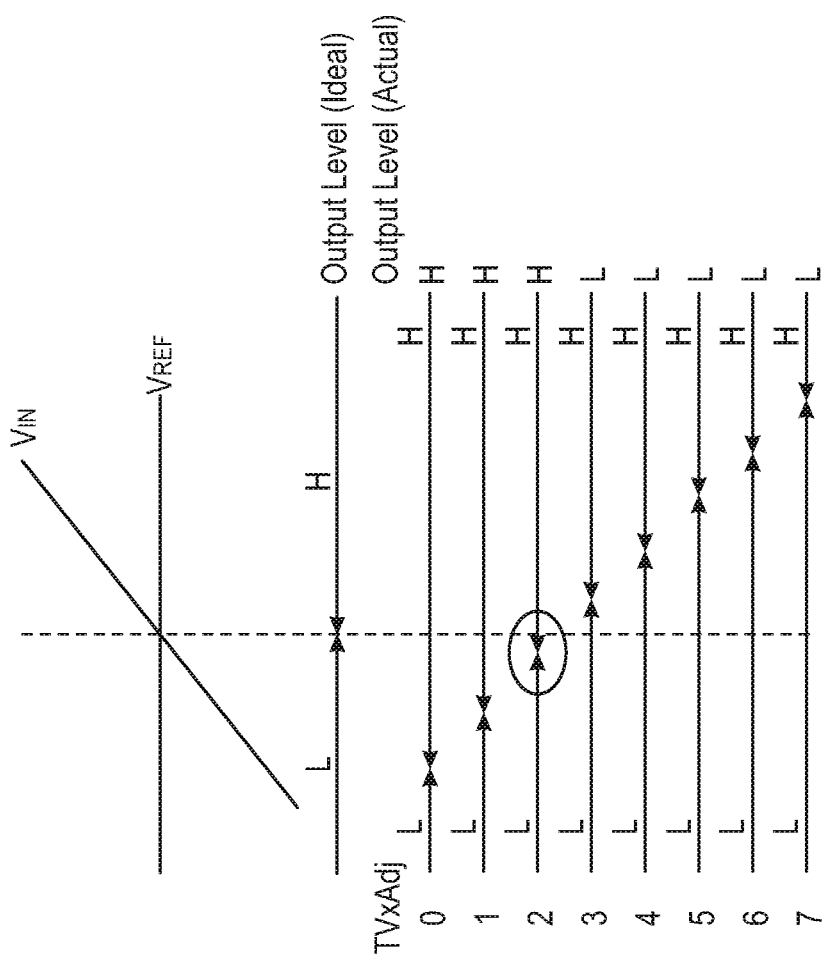
FIG. 2 is a graph-based diagram showing relationships between an output level of a main input buffer and a combination of the input voltage (VIN) and the reference voltage (VREF).
Figure 3A:
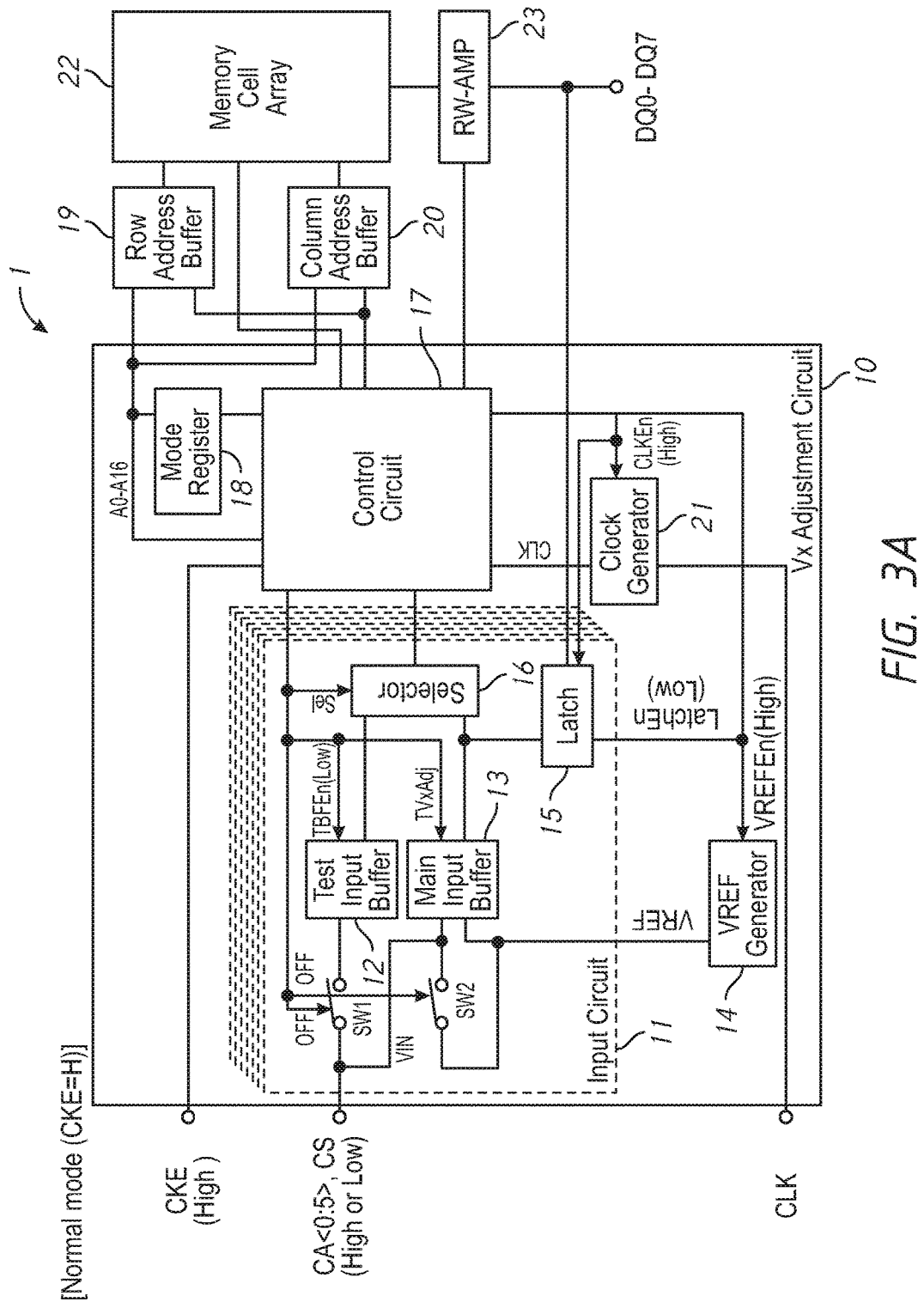
FIG. 3A is a block diagram of an offset voltage (Voff) adjustment circuit in a semiconductor device in a normal mode in accordance with an embodiment of the present disclosure.

FIG. 3A is a block diagram of an offset voltage (Voff) adjustment circuit 10 in a semiconductor device 1 in a normal mode in accordance with an embodiment of the present disclosure. The offset voltage (Voff) adjustment circuit 10 may include a plurality of input circuits 11. Each input circuit 11 may include a test input buffer 12 and a main input buffer 13. For example, the test input buffer 12 may be a logic AND gate. For example, the main input buffer 13 is an input receiver that may be a comparator circuit.

The main input buffer 13 may have an input node and a reference node. The input node of the main input buffer 13 may be permanently coupled to one terminal (e.g., an input pad) of external terminals by a conductive wiring. For example, there may be no switch between the input node of the main input buffer 13 and the one terminal of external terminals. A VREF generator 14 may generate the reference voltage VREF and may provide the reference voltage VREF to the reference node of the main input buffer 13, responsive to a VREF enable signal VREFEn at an active level (e.g., a logic high level). The main input buffer 13 may compare an input signal from the one terminal of the external terminals received at the input node with the reference voltage $V_{REF}$ received at the reference node. The main input buffer 13 may store an offset voltage (Voff) to be adjusted based on a test signal (e.g., Voff adjust control flags TVxAdj). The input node of the main input buffer 13 may be coupled to one of external terminals, such as command/address input terminals (CA<0:5>) and a chip select terminal (CS) of the semiconductor device. The input node of the main input buffer 13 may receive an input signal at either a logic high level or a logic low level from the one of the external terminals. The main input buffer 13 may provide an output signal at a logic high level if a relative voltage, which means that the input voltage VIN of the input signal relative to the reference voltage VREF after adjustment of the offset voltage (Voff) based on the test signal is positive, and may provide the output signal at a logic low level if the relative voltage is negative.

The normal mode may be instructed by a combination of CA<0:5> signals, CS signal and a clock enable signal (CKE) being active (e.g., at a logic high level). The input circuit 11 may include a switch SW1 and a switch SW2. The switch SW1 is disposed between the one terminal of external terminals and an input node of the test input buffer 12. The switch SW2 is disposed between the one terminal of the external terminals and the reference node of the main input buffer 13. In the normal mode, the switch SW1 and the switch SW2 are open (e.g., turned off). For example, the external terminals may receive the CA<0:5> signals and the CS signal from a memory controller (not shown). For example, one command may be transmitted over a plurality of command cycles from the memory controller to the external terminals of the semiconductor device. For example, one command cycle may be defined by two pairs of consecutive rising and falling edges or falling and rising edges of the CS signal. A combination of CA<0:5> signals may be indicative of a command (e.g., read, write, precharge, etc.) and addresses of a memory cell (e.g., a bank address, a row address and a column address). The command and the addresses may be transmitted over the plurality of command cycles. The main input buffer 13 may provide the output signal to a selector 16 that selectively provides the output signal of the main input buffer 13 to a control circuit 17 responsive to a select signal (Sel) from the control circuit 17. For example, a signal level of the select signal (Sel) may be a logic low level, indicative of selecting the main input buffer 13 as an input source in the normal mode. The control circuit 17 may receive a clock signal CLK from a clock generator 21 and may receive the output signal of the main input buffer 13 from the selector 16. When the command is indicative of one of commands in the normal mode, the control circuit 17 may set a command mode (e.g., a read mode, a write mode, etc.) to a mode register 18 by providing addresses (A0-A16) to the mode register 18. In the normal mode, the control circuit 17 may provide the select signal (Sel) instructing the selector 16 to selectively transmit the output signal of the main input buffer 13. The control circuit 17 may provide OFF signals instructing the switches SW1 and SW2 to turn off to be in an inactive state. The control circuit 17 may transmit an internal clock enable signal CLKEn that is active (e.g., a logic high level) to a clock generator 21 responsive to the active clock enable signal CKE. Responsive to the active internal clock enable signal CLKEn, the clock generator 21 may provide the clock signal CLK in the normal mode. The control circuit 17 may provide a test input buffer enable signal TBFEn that is inactive (e.g., a logic low level) to the test input buffer 12 and the test input buffer 12 may continue to hold a last buffered state. The control circuit 17 may provide the Voff adjust control flags TVxAdj to the main input buffer 13. The main input buffer 13 may adjust (e.g., reduce) the offset voltage (Voff) of the main input buffer 13 based on the test signal (e.g., Voff adjust control flags TVxAdj), and may provide the output signal that is a result of comparison of the input voltage (VIN) and the reference voltage VREF. A read/write amplifier (RW-AMP) 23 may be activated by the control circuit 17 for memory access, such as read operation or write operation, and a memory cell in the memory cell array 22 may be activated by the row address buffer 19 storing the row address of the memory cell and the column address buffer 20 storing the column address of the memory cell. Thus, data (e.g., DQ0-DQ7) may be read from or written to the memory cell array 22 responsive to the read or write command. The control circuit 17 may also provide a latch enable signal LatchEn indicative of an inactive status (e.g., a logic low level) to a latch 15, and the latch 15 becomes inactive in the normal mode.

Figure 3B:
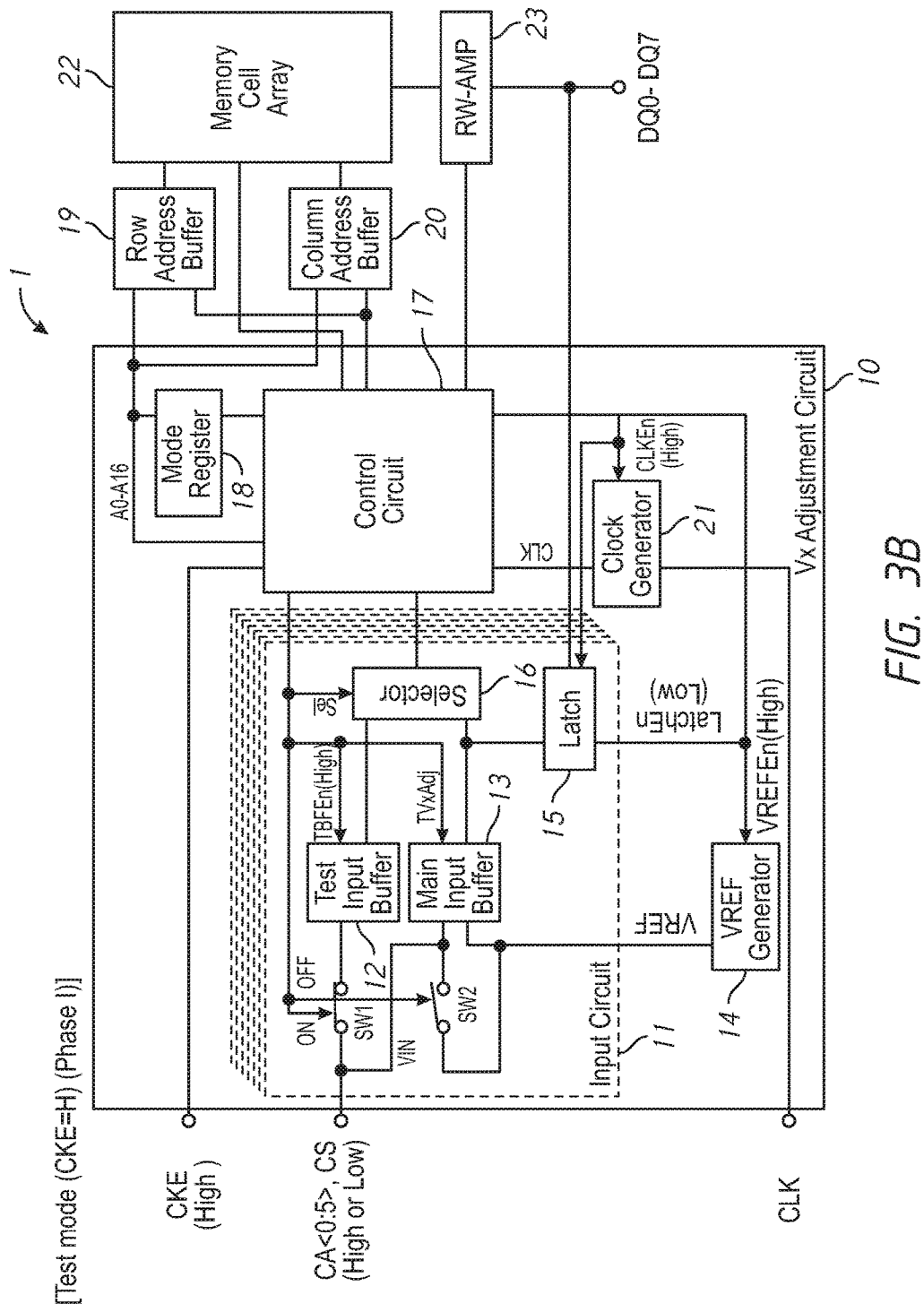
FIG. 3B is a block diagram of the offset voltage (Voff) adjustment circuit in a semiconductor device in a first phase (Phase I) of a test mode in accordance with an embodiment of the present disclosure.

FIG. 3B is a block diagram of the offset voltage (Voff) adjustment circuit 10 in a semiconductor device 1 in a first phase (Phase I) of a test mode in accordance with an embodiment of the present disclosure. Description of components corresponding to components included in FIG. 3A will not be repeated, and changes from FIG. 3A including signal relationships between the components will be described. For example, the first phase (Phase I) of the test mode may be signaled by a combination of an active clock enable signal CKE (e.g., CKE is at a logic high level) and CA<0:5> signals from the external terminals indicative of a command related to the test mode. The control circuit 17 may transmit an internal clock enable signal CLKEn that is active (e.g., a logic high level) to a clock generator 21 responsive to the active clock enable signal CKE. Responsive to the active internal clock enable signal CLKEn, the clock generator 21 may provide the clock signal CLK in the first phase of the test mode. The control circuit 17 may receive a command indicative of a test mode as a combination of CA<0:5> and CS signals while the clock enable signal CKE is still active (e.g., at a logic high level), and the offset voltage (Voff) adjustment circuit 10 may execute operations of the first phase of the test mode. The control circuit 17 may set the test mode to the mode register 18. The control circuit 17 may provide the test input buffer enable signal TBFEn that is active (e.g., a logic high level) to the test input buffer 12, and the test input buffer 12 may be activated responsive to the test input buffer enable signal TBFEn. The control circuit 17 may provide an ON signal to the switch SW1 to be in an active state while providing the OFF signal to the switch SW2 to be in an inactive state. Thus, the switch SW1 couples one terminal of the external terminals to the test input buffer 12.

The test input buffer 12 may receive the input signal from one of the external terminals. The test input buffer 12 may provide an output signal to the selector 16. The control circuit 17 may provide the select signal (Sel) that may instruct the selector 16 to select the test input buffer 12 as the input source. For example, the select signal (Sel) may be at a logic high level. The selector 16 may selectively provide the output signal from the test input buffer 12 to the control circuit 17, responsive to the select signal (Sel) from the control circuit 17.

The main input buffer 13 may receive the input signal from the one of the external terminals and the reference voltage VREF from the VREF generator 14 that is responsive to an active signal (e.g., a logic high level) of a VREF enable signal VREFEn from the control circuit 17. The main input buffer 13 may receive the Voff adjust control flags TVxAdj. For example, the Voff adjust control flags TVxAdj may be set to a default combination of values, such as "000", included in the command. The default combination of values may be any other combination of values (e.g., if the Voff adjust control flags TVxAdj are three bit flags, any combination of values from 000 to 111 may be selected) that may be provided in the command via the external terminals. Because the selector 16 may select the test input buffer 12 as the input source in the first phase of the test mode, the output signal of the main input buffer 13 may not be provided to the control circuit 17. The control circuit 17 may also provide a latch enable signal LatchEn indicative of an inactive status (e.g., a logic low level) to a latch 15, and the latch 15 is inactive responsive to the inactive latch enable signal LatchEn in the first phase of the test mode.

Figure 3C:
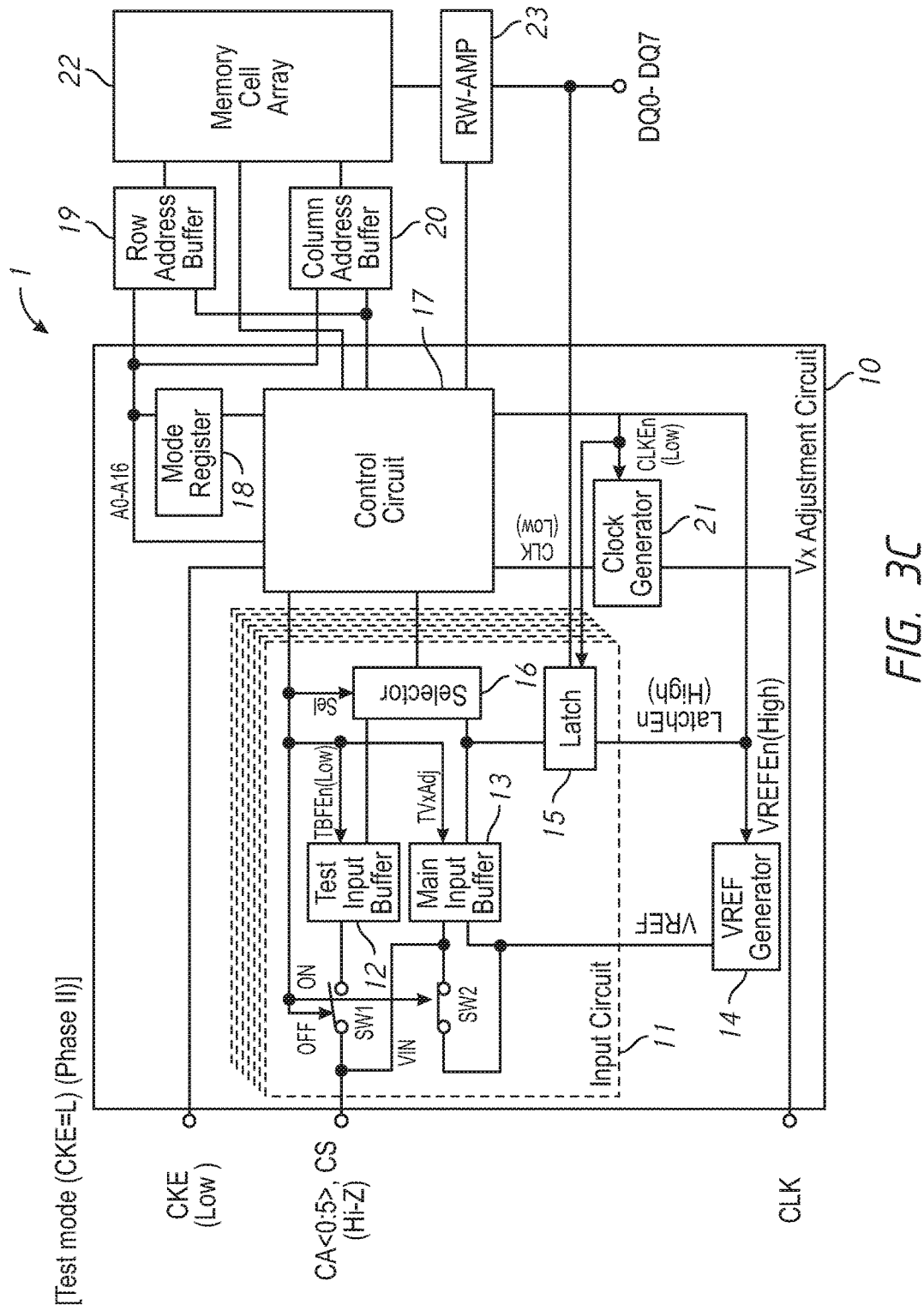
FIG. 3C is a block diagram of the offset voltage (Voff) adjustment circuit in a semiconductor device in a second phase (Phase II) of the test mode in accordance with an embodiment of the present disclosure.

FIG. 3C is a block diagram of the offset voltage (Voff) adjustment circuit 10 in a semiconductor device 1 in a second phase (Phase II) of the test mode in accordance with an embodiment of the present disclosure. Description of components corresponding to components included in FIGS. 3A and 3B will not be repeated, and changes from FIGS. 3A and 3B including signal relationships between the components will be described. For example, the second phase (Phase II) of the test mode may be signaled by an inactive clock enable signal CKE (e.g., at a logic low level). Responsive to the inactive clock enable signal CKE, the control circuit 17 may provide the OFF signal to the switch SW1 in order to turn off the switch SW1 to be in an inactive state. The control circuit 17 may provide the test input buffer enable signal TBFEn that is inactive (e.g., a logic low level) to the test input buffer 12. Thus, the test input buffer 12 may hold a previous state.

Responsive to the inactive clock enable signal CKE, the control circuit 17 may provide the ON signal to the switch SW2 in order to turn on the switch SW2. For example, each of external terminals, such as CA<0:5> and CS signals, may be set to a floating state with a high impedance (Hi-Z). Thus, the input node and the reference node of the main input buffer 13 may receive the reference voltage VREF from the VREF generator 14. The main input buffer 13 may adjust an offset voltage (Voff) based on the Voff adjust control flags TVxAdj representing a combination of values (e.g., 000, 001, ... 111) while the reference voltage is being provided to the input node of the main input buffer 13. For example, the main input buffer 13 may provide the output signal that is based on a comparison result of the reference voltage ($V_{REF}$) provided to the input node and the reference node, after adjustment to the offset voltage (Voff) to reduce the offset voltage (Voff). Thus, the main input buffer 13 may provide the output signal at a logic high level, if a voltage of the input node is equal to or higher than the reference voltage VREF. The main input buffer 13 may provide the output signal at a logic low level if the voltage of the input node is lower than the reference voltage VREF.

Responsive to the inactive clock enable signal CKE, the control circuit 17 may provide an internal clock enable signal CLKEn that is inactive (e.g., logic low level) to the clock generator 21 and the latch 15. The control circuit 17 may provide the latch enable signal LatchEn indicative of an active status (e.g., a logic high level) to the latch 15, and the latch 15 becomes active responsive to the active latch enable signal LatchEn in the second phase of the test mode. While the latch 15 is being active, the latch 15 may receive the output signal from the main input buffer 13 responsive to the active internal clock enable signal CLKEn. The latch 15 may latch the output signal responsive to one edge (e.g., a rising edge) of the internal clock enable signal CLKEn, which may function as a timing signal for latching, thus responsive to the one edge of the clock enable signal CKE, signaling activation the clock generator 21 and switching to the first phase of the test mode from the second phase of the test mode. The latch 15 may hold the output signal latched, and provide to the latched signal to one of data terminals (e.g., DQ0-DQ7). In the second phase of the test mode, the clock generator 21 may provide a clock signal CLK having a constant logic level (e.g., a logic low level) responsive to the inactive internal clock enable signal CLKEn, and the control circuit 17 may hold a state until the clock enable signal CKE may become active and the clock generator 21 resumes.

A tester (not shown, outside of the semiconductor device 1) may monitor the output signal from the data terminals while repeating the first phase and the second phase of the test mode and changing a combination of values of the Voff adjust control flags TVxAdj (e.g., 000, 001, ... 111) in each time of the first phase, to obtain an inversion point where a signal level of the output signal flips from a logic low level to a logic high level, or the logic high level to the logic low level, responsive to a change of the Voff adjust control flags TVxAdj. The tester may store the Voff adjust control flags TVxAdj at the inversion point, and provide the Voff adjust control flags TVxAdj to an anti-fuse circuit (e.g., the control circuit 17) in the semiconductor device 1.

Figure 3D:
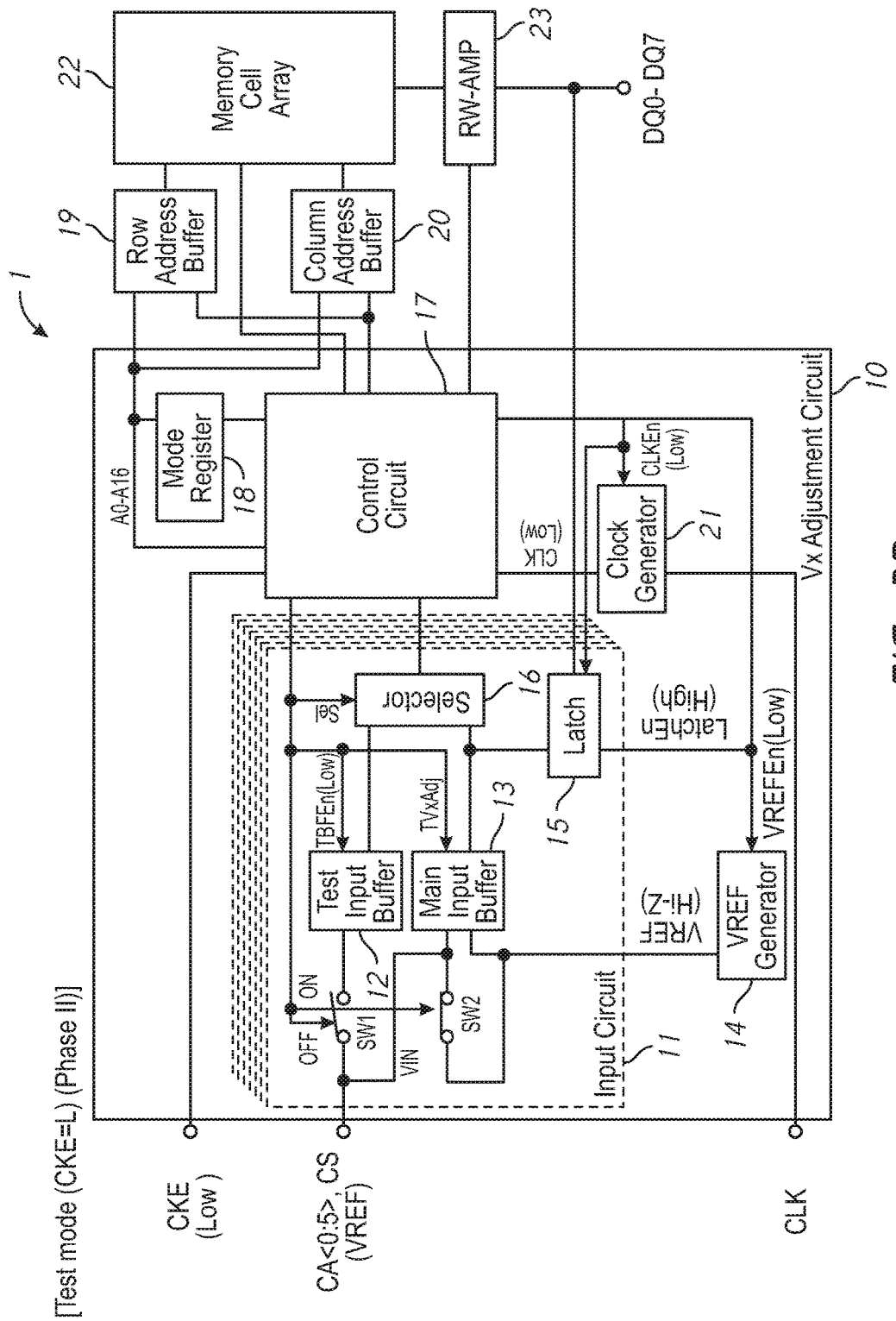
FIG. 3D is a block diagram of the offset voltage (Voff) adjustment circuit in a semiconductor device in a second phase (Phase II) of the test mode in accordance with an embodiment of the present disclosure.

FIG. 3D is a block diagram of the offset voltage (Voff) adjustment circuit 10 in a semiconductor device 1 in a second phase (Phase II) of the test mode in accordance with an embodiment of the present disclosure. Description of components corresponding to components included in FIGS. 3A, 3B and 3C will not be repeated, and changes from FIGS. 3A, 3B and 3C including signal relationships between the components will be described. Instead of providing the reference voltage VREF to the input node of the main input buffer 13 from the VREF generator 14 as shown in FIG. 3C, the external terminals may provide the reference voltage VREF that is generated externally. The switch SW2 is ON and couples one of the external terminals providing the reference voltage VREF to the input node and the reference node of the main input buffer 13. Here, the VREF generator 14 may be disabled to provide the reference voltage VREF as the control circuit 17 provides a VREF enable signal VREFEn that is inactive (e.g., a logic low level). A signal from the VREF generator 14 may be set to the floating state (Hi-Z), instead.

Figure 4:
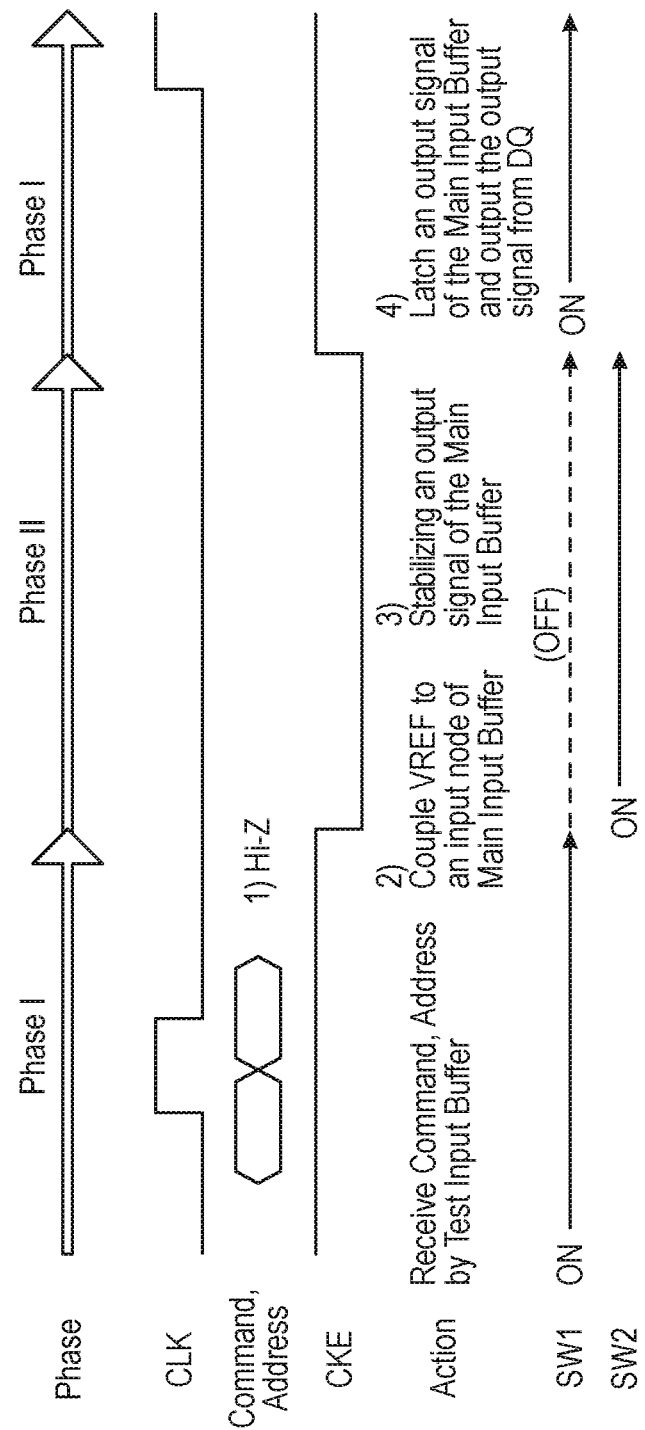
FIG. 4 is a timing diagram of the offset voltage (Voff) adjustment circuit in a semiconductor device in the test mode in accordance with an embodiment of the present disclosure.

FIG. 4 is a timing diagram of the offset voltage (Voff) adjustment circuit 10 in a semiconductor device I in the test mode in accordance with an embodiment of the present disclosure. In the first phase (Phase I), the clock enable signal CKE is set to a logic high level, and the switch SW1 is ON and couples each of the external terminals to the respective test input buffer 12. The test input buffers 12 receive a command and an address from the external terminals. In the second phase (Phase II), the external terminals are set to the floating state (e.g., 1) Hi-Z in FIG. 4), and the clock enable signal CKE is set to a logic low level. The switch SW1 is turned off into an inactive state and decouples the test input buffers 12 from the external terminals. The switch SW2 is ON into an active state and couples the VREF generator 14 to the input node and the reference node of the main input buffer 13 (e.g., 2) in FIG. 4). The main input buffer 13 may provide the output signal that is based on a comparison result of the reference voltage (VREF) provided to the input node relative to the reference voltage (VREF) to the reference node, after adjustment to the offset voltage (Voff) based on the Voff adjust control flags TVxAdj, such as reduction of the offset voltage (Voff). After stabilizing the output signal of the main input buffer 13 (e.g., 3) in FIG. 4), the clock enable signal CKE is set to the logic high level again (e.g., 4) in FIG. 4) and the test mode is switched back to the first phase (Phase I), The latch 15 may latch and hold the output signal, and provide the latched signal to one of data terminals (e.g., DQ0-DQ7). The output signal responsive to the Voff adjust control flags TVxAdj may be monitored by an external tester and an appropriate Voff adjust control flags TVxAdj may be stored and used for the offset voltage (Voff) adjustment.

Figure 5A:
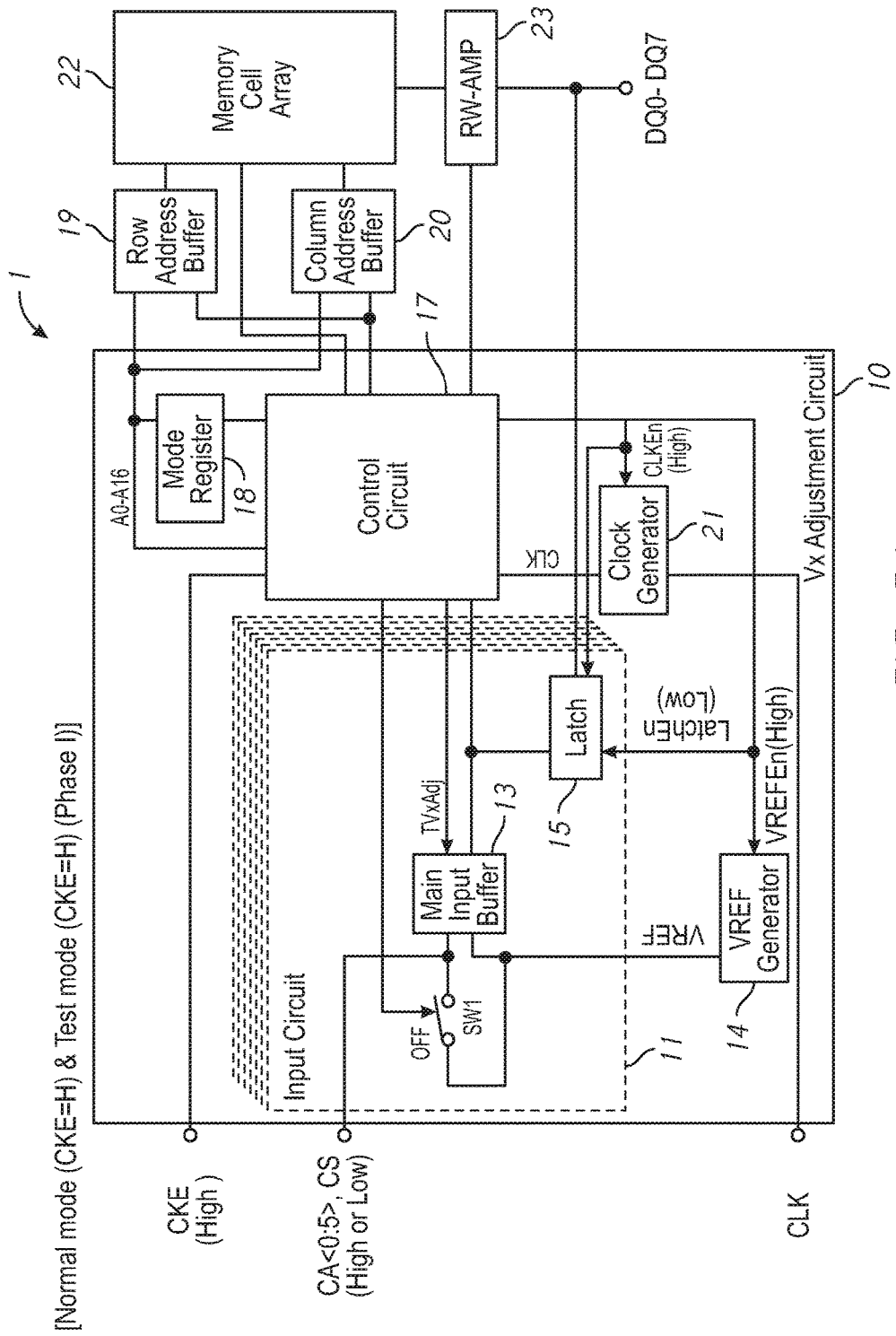
FIG. 5A is a block diagram of an offset voltage (Voff) adjustment circuit in a semiconductor device in a normal mode and in a first phase (Phase I) of a test mode in accordance with an embodiment of the present disclosure.

FIG. 5A is a block diagram of an offset voltage (Voff) adjustment circuit 10 in a semiconductor device 1 in a normal mode and in a first phase (Phase I) of a test mode in accordance with an embodiment of the present disclosure. Description of components corresponding to components included in FIGS. 3A and 3B will not be repeated, and changes from FIGS. 3A and 3B including signal relationships between the components will be described. For example, the input circuit 11 may not include the test input buffer 12 included in FIGS. 3A and 3B, the SW1 in FIGS. 3A and 3B that couples the external terminals to the test input buffer 12 and the selector 16 in FIGS. 3A and 3B. A main input buffer 13 in FIG. 5A may have an input node and a reference node. For example, SW1 of FIG. 5A has one end coupled to the input node of the main input buffer 13 and the other end coupled to the reference node of the main input buffer 13 further coupled to a VREF generator 14, similarly to the SW2 in FIGS. 3A and 3B. Similarly to the input circuit 11 of FIGS. 3A and 3B, the input node of the main input buffer 13 may be permanently coupled to one terminal of external terminals by a conductive wiring.

The normal mode may be instructed by a clock enable signal (CKE) being active (e.g., at a logic high level). In the normal mode, a switch SW1 is open (e.g., turned off). The main input buffer 13 may compare an input signal from one terminal of the external terminals received at the input node, with the reference voltage VREF received at the reference node. The main input buffer 13 may store an offset voltage (Voff) to be adjusted based on a test signal (e.g., Voff adjust control flags TVxAdj). The main input buffer 13 may provide an output signal at a logic high level if a relative voltage, which means the input voltage VIN of the input signal relative to the reference voltage VREF after adjustment of the offset voltage (Voff) based on the test signal is positive, and may provide the output signal at a logic low level if the relative voltage is negative. The main input buffer 13 may provide the output signal to the control circuit 17. The control circuit 17 may receive a clock signal CLK from a clock generator 21 and may receive the output signal of the main input buffer 13. When the command is indicative of one of commands in the normal mode, the control circuit 17 may set a command mode (e.g., a read mode, a write mode, etc.) to a mode register 18 by providing addresses (A0-A16) to the mode register 18. The control circuit 17 may provide an OFF signal instructing the switch SW1 to turn off, responsive to the command mode. The control circuit 17 may provide the Voff adjust control flags TVxAdj for adjusting the offset voltage (Voff) to the main input buffer 13. The main input buffer 13 may adjust (e.g., reduce) the offset voltage Voff of the main input buffer 13 based on the test signal (e.g., Voff adjust control flags TVxAdj), and may provide the output signal that is a result of comparison of the input voltage VIN and the reference voltage VREF with adjustment to the offset voltage Voff.

For example, the first phase (Phase I) of the test mode may be signaled by a combination of an active clock enable signal CKE (e.g., CKE is at a logic high level) and CA<0:5> signals from the external terminals indicative of a command related to the test mode. The main input buffer 13 may provide the output signal to the control circuit 17. The control circuit 17 may receive a command indicative of a test mode as a combination of CA<0:5> and CS signals while the clock enable signal CKE is still active (e.g., at a logic high level), and the offset voltage (Voff) adjustment circuit 10 may execute operations of the first phase of the test mode, similarly to the first phase of the test mode referring to FIG. 3B. The control circuit 17 may keep providing the OFF signal to the switch SW1. Thus, the input node of the main input buffer 13 may receive the input signal from one of the external terminals and the reference voltage VREF from the VREF generator 14 that is responsive to an active signal (e.g., a logic high level) of a VREF enable signal VREFEn from the control circuit 17. The main input buffer 13 may receive the Voff adjust control flags TVxAdj. For example, the Voff adjust control flags TVxAdj may be set to a default combination of values, such as "000", included in the command. The default combination of values may be any other combination that may be provided in the command via the external terminals. The control circuit 17 may also provide a latch enable signal LatchEn indicative of an inactive status (e.g., a logic low level) to a latch 15, and the latch 15 is inactive responsive to the inactive latch enable signal LatchEn in the first phase of the test mode.

Figure 5B:
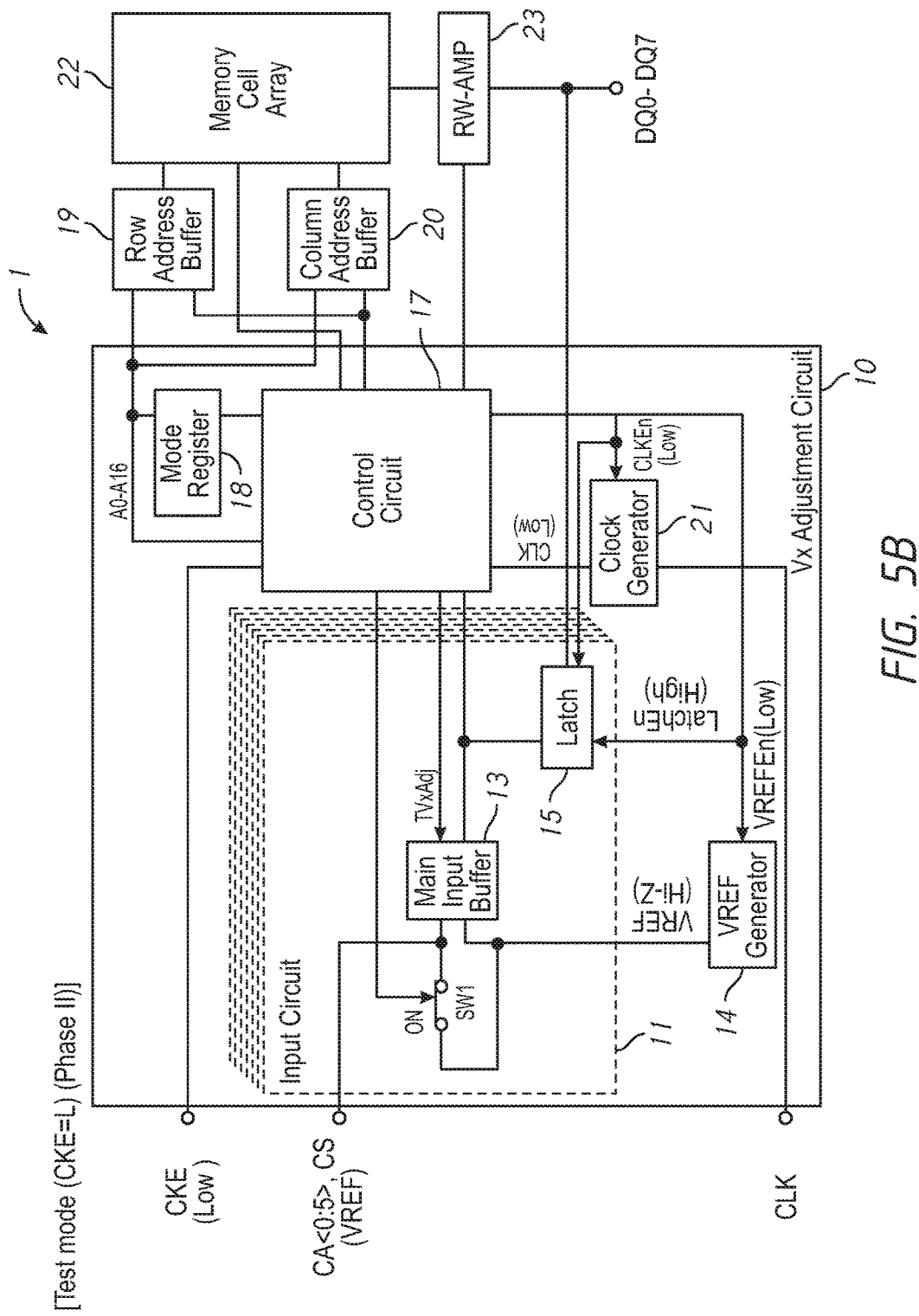
FIG. 5B is a block diagram of an offset voltage (Voff) adjustment circuit in a semiconductor device in a second phase (Phase II) of the test mode in accordance with an embodiment of the present disclosure.

FIG. 5B is a block diagram of an offset voltage (Voff) adjustment circuit 10 in a semiconductor device 1 in a second phase (Phase II) of the test mode in accordance with an embodiment of the present disclosure. Description of components corresponding to components included in FIG. 5A will not be repeated and changes from FIG. 5A including signal relationships between the components will be described. For example, the second phase (Phase II) of the test mode may be signaled by an inactive clock enable signal CKE (e.g., at a logic low level). Here, the VREF generator 14 may be disabled to provide the reference voltage VREF as the control circuit 18 provides a VREF enable signal VREFEn that is inactive (e.g., a logic low level). Thus, a signal from the VREF generator 14 may be set to the floating state (Hi-Z). Responsive to the inactive clock enable signal CKE, the control circuit 17 may provide the ON signal to the switch SW in order to turn on the switch SW1. The switch SW may couple one terminal of the external terminals, which provides the reference voltage VREF generated externally, to the reference node of the main input buffer 13 as well as the input node of the main input buffer 13.

The main input buffer 13 may adjust an offset voltage (Voff) based on the Voff adjust control flags TVxAdj representing a combination of values (e.g., 000, 001, . . . 111) while the reference voltage is being provided to the input node of the main input buffer 13. For example, the main input buffer 13 may provide the output signal that is based on a comparison result of the reference voltage (VREF) provided to the input node and the reference node, with adjustment to the offset voltage (Voff) in order to minimize the effect of the offset voltage (Voff).

Figure 5C:
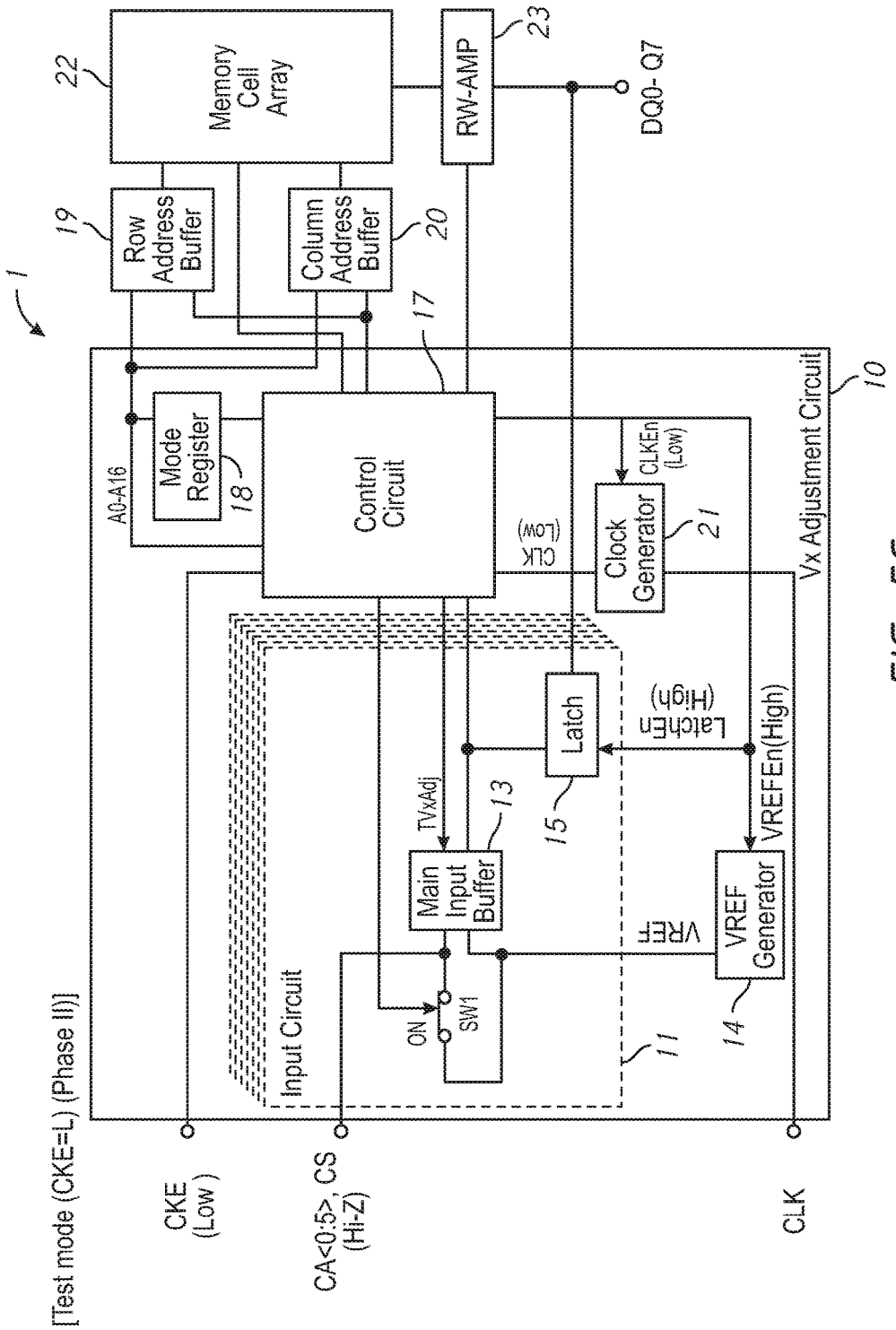
FIG. 5C is a block diagram of an offset voltage (Voff) adjustment circuit in a semiconductor device in a second phase (Phase II) of the test mode in accordance with an embodiment of the present disclosure.

FIG. 5C is a block diagram of an offset voltage (Voff) adjustment circuit 10 in a semiconductor device in a second phase (Phase II) of the test mode in accordance with an embodiment of the present disclosure. Description of components corresponding to components included in FIGS. 5A and 5B will not be repeated and changes from FIGS. 5A and 5B including signal relationships between the components will be described. Instead of providing the reference voltage VREF to the input node of the main input buffer 13 from the external terminals as shown in FIG. 5B, the VREF generator 14 may provide the reference voltage VREF, responsive to the active VREF enable signal VREFEn (e.g., a logic high level). On the other hand, for example, each of external terminals, such as CA<0:5> and CS signals, may be set to a floating state with a high impedance (Hi-Z). Responsive to the inactive clock enable signal CKE, the control circuit 17 may provide the ON signal to the switch SW1 in order to turn on the switch SW1. The switch SW1 couples the VREF generator 14 providing the reference voltage VREF to the input node and the reference node of the main input buffer 13. Thus, the input node and the reference node of the main input buffer 13 may receive the reference voltage VREF from the VREF generator 14.

The above description has included embodiments in the context of external terminals including command/address input terminals (CA<0:5>) and a chip select terminal (CS). However, the inventions may be applied to embodiments other external terminals of semiconductor devices. Examples of the external terminals may include, but not be limited to, data terminals (DQ) and a data mask signal terminal (DQM).

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

What is claimed is:

1. An apparatus comprising:
an input pad;
a first input buffer including a first input node and a second input node;
a conductive wiring configured to permanently couple between the input pad and the first input node of the first input buffer to provide a permanent electrical path between the input pad and the first input node of the first input buffer, and to couple an input signal from the input pad to the first input node; and
a first switch coupled to the first input node of the first input buffer to couple a reference voltage to the first input node of the first input buffer when the input signal from the input pad is at a floating state.

2. The apparatus of claim 1, further comprising:
a reference voltage generator coupled to the second input node of the first input buffer and configured to generate a reference voltage.

3. The apparatus of claim 2, wherein the first input buffer is configured to provide a signal responsive to a relative voltage that is a first voltage at the first input node relative to a second voltage at the second input node, and
wherein the first input buffer is configured to receive a test signal and further configured to adjust the relative voltage responsive to the test signal.

4. The apparatus of claim 1, further comprising:
a second input buffer including a third input node and a fourth input node; and
a second switch configured to couple the input pad to the third input node of the second input buffer.

5. The apparatus of claim 4, wherein the input pad is configured to provide at least a part of a command, and
wherein the second switch is configured to couple the input pad and the third input node of the second input buffer responsive to at least part of a command provided to the input pad.

6. The apparatus of claim 1, further comprising an enable input pad, wherein the first switch is configured to couple the input pad and the second input node responsive to an enable signal provided to the enable input pad.

7. The apparatus of claim 6, further comprising a reference voltage generator coupled to the second input node of the first input buffer and configured to generate a reference voltage,
wherein one of the reference voltage generator and the input pad is configured to provide the reference voltage to the first input node and the second input node responsive to the enable signal, and
wherein the other of the reference voltage generator and the input pad is at a floating state responsive to the enable signal.

8. An apparatus comprising:
an input pad;
a first input buffer including a first input node and a second input node, the first input node being permanently coupled to the input pad by a conductive wiring that provides a permanent electrical path between the first input node and the input pad and that couples an input signal from the input pad to the first input node; and
a first switch coupled between the first and second input nodes of the first input buffer to couple a reference voltage to the first input node of the first input buffer when the input signal from the input pad is at a floating state;
wherein the apparatus is configured to perform operations in a normal mode and a test mode, the test mode comprising a first phase and a second phase,
wherein the first switch is open in the normal mode; and
wherein the first switch is open in the first phase of the test mode and the first switch is closed responsive, at least in part, to a change of the test mode from the first phase to the second phase.

9. The apparatus of claim 8, further comprising a control circuit configured to decouple the first input node and the second input node of the first input buffer in a first phase and couple the first input node and the second input node of the first input buffer in a second phase following to the first phase.

10. The apparatus of claim 9, wherein the control circuit is configured to receive a first control signal from the input terminal pad in the first phase and send a second control signal to the first input buffer in the second phase, wherein the second control signal is produced correspondingly to the first signal.

11. The apparatus of claim 10, wherein the first input buffer is configured to perform a voltage comparison between the first input node and the second input node and the voltage comparison is affected by an amount of an offset voltage of the first input buffer; and
wherein the amount of the offset voltage of the first input buffer is adjusted by the second control signal.

12. An apparatus comprising:
an input terminal;
an input buffer including a first input node coupled to the input terminal by a conductive wiring that provides a permanent electrical path between the input terminal and the first input node and that couples an input signal from the input terminal to the first input node, and further including a second input node and an output node;
a switch configured to couple the first input node and the second input node of the input buffer and to couple a reference voltage to the first input node of the input buffer when the input signal from the input terminal is at a floating state; and
a control circuit configured to decouple the first and second input nodes in a first phase and couple the first and second input nodes in a second phase following the first phase.

13. The apparatus of claim 12, wherein the control circuit is configured to receive a first control signal from the input terminal in the first phase and send a second control signal to the input buffer in the second phase, wherein the second control signal is produced correspondingly to the first control signal.

14. The apparatus of claim 13, wherein the input buffer is configured to perform a voltage comparison between the first input node and the second input node and the voltage comparison is affected by an amount of an offset voltage of the first input buffer; and
wherein the amount of the offset voltage of the first input buffer is adjusted by the second control signal.

15. The apparatus of claim 12, further comprising a reference voltage generator configured to supply a reference voltage to the second input node of the input buffer in each of the first and second phases.

16. The apparatus of claim 12, further comprising a reference voltage generator coupled to the second input node of the input buffer and configured not to supply any voltages to the second input node in the second phase;
   wherein the input terminal is configured to receive a reference voltage externally in the second phase.

17. The apparatus of claim 12, wherein the control circuit is further configured to externally output an output signal from the input buffer via a DQ terminal in a third phase following the second phase.

* * * * *